(12) United States Patent  
Koike

(10) Patent No.: US 7,740,702 B2
(45) Date of Patent: Jun. 22, 2010

(54) SILICON WAFER AND METHOD FOR MANUFACTURING THE SAME

(75) Inventor: Yasuo Koike, Tokyo (JP)

(73) Assignee: Sumitomo Mitsubishi Silicon Corporation, Tokyo (JP)

(*) Notice: Subject to any disclaimer, the term of this patent is extended or adjusted under 35 U.S.C. 154(b) by 105 days.

(21) Appl. No.: 11/643,841

(22) Filed: Dec. 22, 2006

(65) Prior Publication Data
US 2007/0101925 A1 May 10, 2007

Related U.S. Application Data

(62) Division of application No. 10/368,359, filed on Feb. 20, 2003, now Pat. No. 7,160,385.

(51) Int. Cl.
C30B 29/06 (2006.01)

(52) U.S. Cl. ............... 117/13; 117/14; 117/15; 117/16; 117/20

(58) Field of Classification Search ............... 117/900, 117/13, 14, 15, 20, 932; 423/345
See application file for complete search history.

(56) References Cited

U.S. PATENT DOCUMENTS

| 5,094,963 | A | 3/1992 | Hiraguchi et al. |
| 6,191,010 | B1 | 2/2001 | Falster |
| 6,537,368 | B2 | 3/2003 | Falster et al. |
| 6,635,587 | B1 | 10/2003 | Mule'Stagno et al. |
| 6,713,370 | B2 | 3/2004 | Falster |
| 6,897,084 | B2 | 5/2005 | Binns et al. |
| 2002/0179003 | A1 | 12/2002 | Iida et al. |
| 2002/0179006 | A1 | 12/2002 | Borgini et al. |
| 2003/0136961 | A1 | 7/2003 | Mule'Stagno et al. |

FOREIGN PATENT DOCUMENTS

| JP | 61-015335 | 1/1986 |
| JP | 05-144827 | 6/1993 |

*Primary Examiner*—Robert M Kunemund
(74) *Attorney, Agent, or Firm*—Clark & Brody

(57) ABSTRACT

A silicon wafer and a method for manufacturing the same are provided, wherein the silicon wafer has no crystal defects in the vicinity of the surface and provides excellent gettering efficiency in the process of manufacturing devices without IG treatment. The oxygen concentration and the carbon concentration are controlled respectively within a range of $11 \times 10^{17}$-$17 \times 10^{17}$ atoms/cm$^3$ (OLD ASTM) and within a range of $1 \times 10^{16}$-$15 \times 10^{16}$ atoms/cm$^3$ (NEW ASTM). A denuded zone having no crystal defects due to the existence of oxygen is formed on the surface and in the vicinity thereof, and oxygen precipitates are formed at a density of $1 \times 10^4$-$5 \times 10^6$ counts/cm$^2$, when a heat treatment is carried out at a temperature of 500-1000° C. for 1 to 24 hours. In the method for manufacturing the silicon wafer, moreover, the silicon wafer having the oxygen and carbon concentrations as controlled above is heat-treated at a temperature of 1100° C.-1380° C. for 1 to 10 hours. The control of the oxygen and carbon concentrations in the growth of a single crystal with CZ method allows a desired density of oxygen precipitates to be attained in the process of manufacturing devices and thereby sufficient gettering efficiency to be obtained.

2 Claims, 7 Drawing Sheets

[X] High Temperature Process

[Y] Low Temperature Process

SILICON WAFER AND METHOD FOR MANUFACTURING THE SAME

CROSS REFERENCE TO RELATED APPLICATIONS

This is a division of U.S. patent application Ser. No. 10/368,359 filed Feb. 20, 2003 now U.S. Pat. No. 7,160,385.

FIELD OF THE INVENTION

The present invention relates to a silicon wafer used as a semiconductor substrate and a method for manufacturing such a silicon wafer, and more specifically to a silicon wafer and a method for manufacturing such a silicon wafer, wherein the number of crystal defects on the surface or in the vicinity of the surface of the wafer, which negatively influence the device properties, can be reduced, and oxygen precipitates necessary for gettering heavy metals, which deteriorate the device property in the process of manufacturing devices, can be generated in the wafer (hereinafter, the oxygen precipitate is occasionally referred to as "BMD: bulk micro defect").

DESCRIPTION OF THE PRIOR ART

In the process of manufacturing semiconductor devices, heavy metals such as Fe, Ni, Cu and the like are apt to contaminate such a device as D-RAM at high temperature treatments. Such heavy metal contamination causes crystal defects to be formed on the surface of a silicon wafer or in the vicinity thereof, thereby enabling various device properties to be deteriorated and further the yield of products to be reduced. Accordingly, such heavy metals as contamination sources have to be removed from the active areas of the device on the wafer surface and in the vicinity thereof.

In view of this fact, a treatment is traditionally carried out to form oxygen precipitates for gettering heavy metals, wherein a wafer before the process of manufacturing devices is heat-treated at a low temperature so as to grow the oxygen precipitating nuclei in the inside thereof (hereinafter, this treatment is referred to as "IG treatment", i.e., Intrinsic Gettering treatment).

Moreover, a further enhancement of the quality of a wafer on the surface and in the vicinity thereof is required in manufacturing a high-integrated device. For this purpose, a silicon wafer is heat-treated at a high temperature more than 1000° C. to diffuse or move oxygen atoms on the surface of the wafer and in the vicinity thereof to the outside of the wafer, so that a defect-free layer is formed in an area (a denuded zone) where the crystal defects due to the existence of oxygen are removed.

In the conventional process of manufacturing devices at a high temperature, where a heat treatment for buried layers is employed, a silicon wafer is heat-treated at a high temperature of 1120° C.-1220° C. As a result, a defect-free layer or a denuded zone can be formed on the surface of the wafer and in the vicinity thereof, so that it is unnecessary to form such a denuded zone before the process of manufacturing devices. However, a high-energy ion implantation process is conventionally employed in the recent process of manufacturing devices so that the heat treatment is carried out at a relatively low temperature. This procedure makes it difficult to form the denuded zone. As a result, it is necessary to form such a denuded zone in the wafer before the process of manufacturing devices.

Silicon wafers are normally prepared from a single crystal produced with the Czochralski method (hereinafter, referred to as "CZ method"), so that a number of oxygen precipitate nuclei are formed in the inside of the wafer during the crystal growth. In this case, a low temperature heat treatment causes the growth of the oxygen precipitate nuclei to be grown and thus oxygen precipitates having a larger size to be provided, thereby making it possible to enhance the function of gettering heavy metals as the sources for polluting the wafer.

When a silicon wafer is subjected to a hi-temperature heat treatment for forming the denuded zone (hereinafter, this treatment is referred to as "DZ treatment"), the oxygen precipitate nuclei in the inside of the silicon wafer shrink and finally disappear. Therefore, the DZ treatment causes the density of the oxygen precipitates to be reduced, so that the gettering efficiency is reduced in the process of manufacturing the devices.

In order to solve such a problem, a two-step heat treatment is conventionally employed, that is, the DZ treatment is firstly applied to a silicon wafer before the process of manufacturing devices, and then the so called IG treatment for the growth of the oxygen precipitating nuclei is applied to the silicon wafer (hereinafter, this treatment is referred to as "DZ-IG treatment"). More specifically, the DZ treatment is applied to the wafer in the first step, and therefore oxygen atoms on the surface and in the vicinity thereof are moved to the outside of the wafer so as to -eliminate the crystal defects resulting from the existence of the oxygen atoms, thereby enabling the denuded zone to be formed. In the second step, the IG treatment is applied to the wafer to grow the oxygen precipitate nuclei in the inside thereof, and thus the oxygen precipitates as gettering sources are generated.

For instance, in Japanese Patent Application Laid-open Publication No. 61-15335, a DZ-IG treatment is described, wherein a wafer, which is prepared from a silicon single crystal grown with the CZ method, is subjected to a diffusion treatment for moving oxygen atoms from the surface of the wafer to the outside at a temperature not less than 1100° C. Thereafter, the wafer is once cooled and then heated at a rate of 1-5° C./min in a temperature range from not more than 600° C. to not less than 800° C. and finally the wafer is subjected to a heat treatment at 1000-1200° C.

In such a DZ-IG treatment, however, the oxygen precipitating nuclei in the inside of the silicon wafer shrink and then disappear, because the temperature of the DZ treatment in the first step is still high for the silicon wafer. As a result, even if the IG treatment in the second step is applied, the density of the oxygen precipitates in the inside of the wafer is still small, so that, in the IG treatment, a long time is required to grow the oxygen precipitates at a high density.

On the other hand, device users require a higher quality of the silicon wafer and, at the same time, a further reduction in the cost thereof. Therefore, it is necessary to provide an improved method for manufacturing a high quality silicon wafer at a reduced cost. In view of these facts, the above-mentioned procedure, i.e., the IG treatment for a long time after the DZ treatment can no longer be employed, because it causes both the number of process steps and the production cost to be increased, and therefore it does not meet the above-mentioned user's requirements.

An epitaxial wafer includes neither defects resulting from the existence of oxygen nor grown-in defects (containing COP: crystal originated particles) formed in growing a silicon single crystal in the epitaxial layer of the surface, on which devices are fabricated. Accordingly, the epitaxial wafer can be used as a silicon wafer including B, As/Sb and the like at a greater concentration, so that the wafer can be used for manufacturing a high performance device such as MPU, flash memory or the like as well as a high performance power device such as MOSFET, IGBT or the like.

When, however, either defects resulting from the existence of oxygen or grown-in defects (containing COP) are already included in the surface of a silicon wafer which is used as an epitaxial wafer, these defects serve as nuclei for forming secondary defects in the epitaxial layer, and therefore this causes the characteristic of the device to be deteriorated.

In the recent process of manufacturing highly integrated devices at a high density, the heat treatment is carried out at a relatively low temperature, and the IG treatment is applied to such an epitaxial wafer in order to avoid both the contamination of the wafer and the formation of crystal defects in the device process. However, the epitaxial growth is carried out at a higher temperature and therefore the oxygen precipitating nuclei in the inside of the wafer decrease and eventually disappear. As a result, the number of the oxygen precipitates to be formed in the IG treatment is decreased, thereby causing the gettering efficiency to be reduced in the process of manufacturing the devices.

SUMMARY OF THE INVENTION

In view of the above-mentioned problems, it is an object of the present invention to provide a silicon wafer which ensures a high efficiency for gettering heavy metals as contamination sources in the process of manufacturing the devices, and which is capable of forming a denuded zone on the surface of the wafer and in the vicinity thereof without applying any IG treatment to the silicon wafer.

It is another object of the present invention to provide a method for manufacturing such a silicon wafer.

The present inventors intensively carried out an experimental investigation for the purpose of producing a silicon wafer capable of providing sufficient gettering efficiency, even if any IG treatment is further not carried out in the process of manufacturing devices. The results obtained in the experimental works reveal that the density of oxygen precipitating nuclei in a silicon single crystal increases with the increase of the oxygen concentration and that the density of oxygen precipitates also increases with the increase of the carbon concentration, although detailed mechanism cannot be ascertained.

Furthermore, it is found that an increased carbon concentration in the silicon wafer does not provide a desired amount of oxygen precipitates even in the application of the low temperature heat treatment, unless a predetermined level of the oxygen concentration is satisfied.

So long as oxygen and carbon atoms are intentionally injected into the silicon wafer and the concentration of each of the two type atoms is adjusted within a corresponding predetermined level, the oxygen precipitating nuclei grow by applying the low temperature heat treatment in the process of manufacturing devices to generate a sufficient amount of oxygen precipitates, even if the high temperature heat treatment is applied beforehand to the silicon wafer in the DZ treatment. As a result, it is possible to getter heavy metals as source of contaminating the wafer.

In accordance with the present invention, the following subject matters, (1) a silicon wafer and (2) a method for manufacturing the silicon wafer, can be realized, based on the above knowledge in the experimental investigation:

(1) A silicon wafer in which the oxygen concentration and the carbon concentration are controlled respectively within a range of $11 \times 10^{17}$-$17 \times 10^{17}$ atoms/cm$^3$ (OLD ASTM) and within a range of $1 \times 10^{16}$-$15 \times 10^{16}$ atoms/cm$^3$ (NEW ASTM), wherein a denuded zone having no crystal defects due to the existence of oxygen is formed on the surface and in the vicinity thereof, and wherein oxygen precipitates are formed at a density of $1 \times 10^4$ counts/cm$^2$-$5 \times 10^6$ counts/cm$^2$, when a heat treatment is carried out at 500-1000° C. for 1 to 24 hours.

(2) A method for manufacturing a silicon wafer, said method comprising the following steps of: controlling the oxygen concentration and the carbon concentration respectively within a range of $11 \times 10^{17}$-$17 \times 10^{17}$ atoms/cm$^3$ (OLD ASTM) and within a range of $1 \times 10^{16}$-$15 \times 10^{16}$ atoms/cm$^3$ (NEW ASTM), and heat-treating said silicon wafer at 1100° C.-1380° C. for 1-10 hours.

In conjunction with the above, it is preferable that the thickness of a denuded zone formed on the surface or in the vicinity of the surface of the silicon wafer is not less than 10 μm. Moreover, it is preferable that the heat treatment in the above-mentioned method for manufacturing the silicon wafer is carried out at a temperature of 1100° C.-1380° C. under an atmosphere of inert gas, or a mixture of inert gas and oxidizable gas, or hydrogen gas, or hydrogen-containing gas.

DESCRIPTION OF PREFERRED EMBODIMENTS

Figure 1:
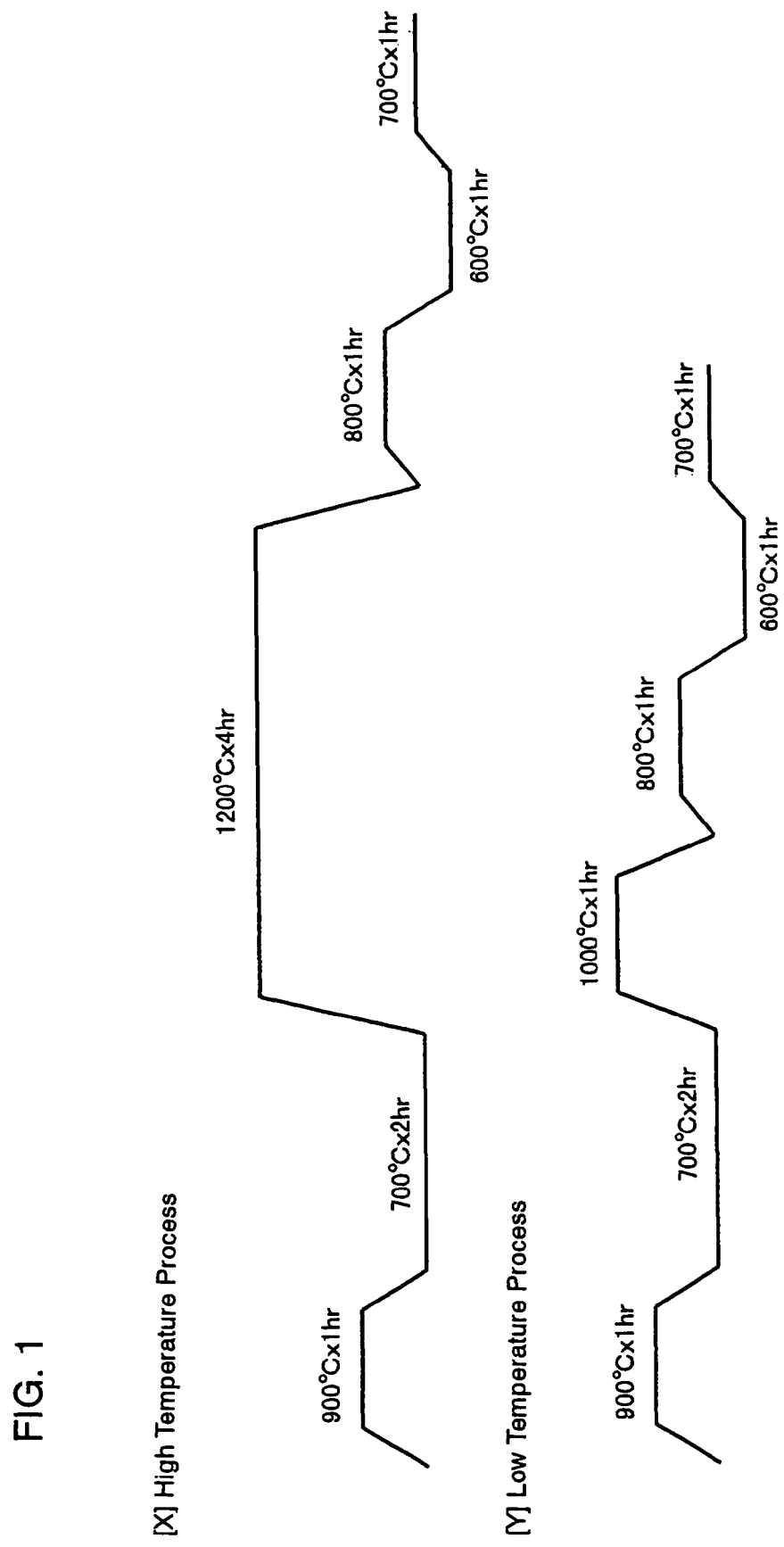
FIG. 1 is a drawing showing temperature patterns in two type evaluation heat treatments in an assumed process of manufacturing devices.

In a silicon wafer according to the present invention, no IG treatment is employed before the process of manufacturing devices. However, oxygen precipitates are generated in the silicon wafer at a concentration of $1 \times 10^4$ counts/cm$^2$-$5 \times 10^6$ counts/cm$^2$ by a low temperature heat treatment in the process of manufacturing devices by controlling each of the oxygen concentration and the carbon concentration within a predetermined level in the silicon wafer, although a denuded zone is formed on the surface of the wafer by applying a high temperature heat treatment in the DZ treatment.

In accordance with the present invention, as described above, a silicon wafer can be produced at a low cost, since no IG treatment is carried out after applying such a high temperature treatment in the DZ treatment to the wafer.

In the silicon wafer according to the present invention, oxygen precipitates are generated at a density of $1 \times 10^4$ counts/cm$^2$-$5 \times 10^6$ counts/cm$^2$, when a heat treatment is carried out for 1 hour-24 hours at a temperature of 500° C.-1000° C. Such an amount of oxygen precipitates is sufficient to obtain an excellent gettering effect in the process of manufacturing devices with a low temperature heat treatment.

However, the present invention is not always restricted to the above-mentioned silicon wafer, which is used in the process of manufacturing devices with the low temperature heat treatment. When a silicon wafer according to the invention is used in the process of manufacturing devices with both the low temperature heat treatment and the high temperature heat treatment, the oxygen precipitates are formed inside the silicon wafer at a density of more than $1\times10^4$ counts/cm², thereby enabling sufficient gettering efficiency to be obtained.

In the silicon wafer according to the present invention, sufficient gettering efficiency can be obtained at a density of oxygen precipitates more than $1\times10^4$ counts/cm², so that the deterioration of device properties, such as the gate oxide integrity and others, can be avoided. However, an excessive density of oxygen precipitates causes the mechanical strength due to the excessive precipitation to be reduced. As a result, it is preferable that the upper limit of the density should be set at $5\times10^6$ counts/cm².

In the method for manufacturing a silicon wafer according to the present invention, the silicon wafer is heat-treated at a high temperature of 1100° C.-1380° C. to form a denuded zone by reducing or eliminating the crystal defects. In particular, the heat treatment at a high temperature of 1280° C.-1380° C. is effective to reduce or eliminate the grown-in defects in the vicinity of the wafer surface.

In this case, it is necessary to carry out the heat treatment for 1 to 10 hours. A heating time of less than one hour provides an insufficient formation of the denuded zone on the wafer surface, whereas a heating time of more than 10 hours causes the wafer to be softened and eventually deformed due to a very high temperature in the heat treatment.

In the method for manufacturing a silicon wafer according to the present invention, it is preferable that the atmosphere in the high temperature treatment comprises inert gas (argon gas, nitrogen gas, or the like) or a mixture of inert gas and oxidizable gas (oxygen gas) in order to protect the surface of the wafer. However, a high temperature heat treatment under inert gas atmosphere causes the surface state of the wafer to be deteriorated and, therefore, it is particularly preferable to carry out the heat treatment under a mixed gas atmosphere containing a small amount of oxidizable gas in an inert gas. Furthermore, in order to eliminate the grown-in defects in the wafer, it is preferable that the heat treatment is carried out under an atmosphere consisting of hydrogen gas or hydrogen-containing gas.

EXAMPLES

The advantages of the silicon wafer according to the present invention will be described in several examples for the process of manufacturing devices. For this purpose, assuming an actual treatment used in the process of manufacturing devices, the evaluation heat treatment was applied to a silicon wafer and then the properties thereof were studied.

FIG. 1 shows two diagrams including two type programs of heat application in the evaluation heat treatment for the process of manufacturing devices. As shown in FIG. 1, the evaluation heat treatment can be classified into a high temperature device manufacturing process [X] including heat treatments at a temperature of 1100° C. or greater (hereinafter, referred to as "X high temperature process"), and a low temperature device manufacturing process [Y] including heat treatments at a temperature less than 1100° C. (hereinafter, referred to as "Y low temperature process").

Example 1

A p-type <100> silicon wafer having a specific resistivity of 10Ω·cm was prepared, using the CZ method, in which case, the silicon wafer included oxygen at a fixed concentration of $14\times10^{17}$ atoms/cm³ and carbon at a varied concentration of $1\times10^{16}$ atoms/cm³-$16\times10^{16}$ atoms/cm³.

In the high temperature heat treatment, the DZ treatment was carried out at a temperature of 1100° C.-1350° C. for one hour under nitrogen gas atmosphere including oxygen gas in a 3% concentration. However, no high temperature heat treatment was carried out in part of Comparative Examples (No. 21-24). Conditions for sample level of the prepared silicon wafers are listed in Table 1.

TABLE 1

| Classification | No. | Sample Level | Evaluation Heat Treatment | Oxygen Concentration (atoms/cm³) | Carbon Concentration (atoms/cm³) | High Temperature Heat Treatment Condition |
|---|---|---|---|---|---|---|
| Inventive Example | 1 | A | X process | $14 \times 10^{17}$ | $1 \times 10^{16}$ | 1100° C. × 1 hr |
| | 2 | A | Y process | $14 \times 10^{17}$ | $1 \times 10^{16}$ | 1100° C. × 1 hr |
| | 3 | B | X process | $14 \times 10^{17}$ | $5 \times 10^{16}$ | 1100° C. × 1 hr |
| | 4 | B | Y process | $14 \times 10^{17}$ | $5 \times 10^{16}$ | 1100° C. × 1 hr |
| | 5 | C | X process | $14 \times 10^{17}$ | $10 \times 10^{16}$ | 1100° C. × 1 hr |
| | 6 | C | Y process | $14 \times 10^{17}$ | $10 \times 10^{16}$ | 1100° C. × 1 hr |
| | 7 | D | X process | $14 \times 10^{17}$ | $15 \times 10^{16}$ | 1100° C. × 1 hr |
| | 8 | D | Y process | $14 \times 10^{17}$ | $15 \times 10^{16}$ | 1100° C. × 1 hr |
| | 9 | E | X process | $14 \times 10^{17}$ | $1 \times 10^{16}$ | 1350° C. × 1 hr |
| | 10 | E | Y process | $14 \times 10^{17}$ | $1 \times 10^{16}$ | 1350° C. × 1 hr |
| | 11 | F | X process | $14 \times 10^{17}$ | $5 \times 10^{16}$ | 1350° C. × 1 hr |
| | 12 | F | Y process | $14 \times 10^{17}$ | $5 \times 10^{16}$ | 1350° C. × 1 hr |
| | 13 | G | X process | $14 \times 10^{17}$ | $10 \times 10^{16}$ | 1350° C. × 1 hr |
| | 14 | G | Y process | $14 \times 10^{17}$ | $10 \times 10^{16}$ | 1350° C. × 1 hr |
| | 15 | H | X process | $14 \times 10^{17}$ | $15 \times 10^{16}$ | 1350° C. × 1 hr |
| | 16 | H | Y process | $14 \times 10^{17}$ | $15 \times 10^{16}$ | 1350° C. × 1 hr |
| Comparative Example | 17 | I | X process | $14 \times 10^{17}$ | None | 1100° C. × 1 hr |
| | 18 | I | Y process | $14 \times 10^{17}$ | None | 1100° C. × 1 hr |
| | 19 | J | X process | $14 \times 10^{17}$ | None | 1350° C. × 1 hr |
| | 20 | J | Y process | $14 \times 10^{17}$ | None | 1350° C. × 1 hr |
| | 21 | K | X process | $14 \times 10^{17}$ | $1 \times 10^{16}$ | None |
| | 22 | K | Y process | $14 \times 10^{17}$ | $1 \times 10^{16}$ | None |

TABLE 1-continued

| Classification | No. | Sample Level | Evaluation Heat Treatment | Oxygen Concentration (atoms/cm$^3$) | Carbon Concentration (atoms/cm$^3$) | High Temperature Heat Treatment Condition |
|---|---|---|---|---|---|---|
| | 23 | L | X process | 14 × 10$^{17}$ | 15 × 10$^{16}$ | None |
| | 24 | L | Y process | 14 × 10$^{17}$ | 15 × 10$^{16}$ | None |
| | 25 | M | X process | 14 × 10$^{17}$ | 0.5 × 10$^{16}$ | 1100° C. × 1 hr |
| | 26 | M | Y process | 14 × 10$^{17}$ | 0.5 × 10$^{16}$ | 1100° C. × 1 hr |
| | 27 | N | X process | 14 × 10$^{17}$ | 16 × 10$^{16}$ | 1350° C. × 1 hr |
| | 28 | N | Y process | 14 × 10$^{17}$ | 16 × 10$^{16}$ | 1350° C. × 1 hr |

Firstly, the density of oxygen precipitates in the silicon wafer was measured in order to ascertain the efficiency for gettering heavy metals as contamination sources in the wafer. For this purpose, the relationship between the density of oxygen precipitates and the yield of devices having gate oxide integrity in a silicon wafer intentionally contaminated with Ni was investigated.

A wafer having sample level E was used as for a silicon wafer intentionally contaminated with Ni, and an additional heat treatment for precipitating oxygen at 700° C. for 1-8 hours was applied to the wafer to vary the density of oxygen precipitates. In this case, the X high temperature process was employed for the evaluation heat treatment employed. After the evaluation heat treatment, the wafer was intentionally contaminated with Ni to obtain a Ni concentration of 1×10$^{11}$ atoms/cm$^2$. Furthermore, after a heat treatment for diffusing such Ni contamination into the wafer was applied, electrodes having a MOS structure were fabricated on the surface of the wafer, and then the yield of devices having gate oxide integrity was determined.

Figure 2:
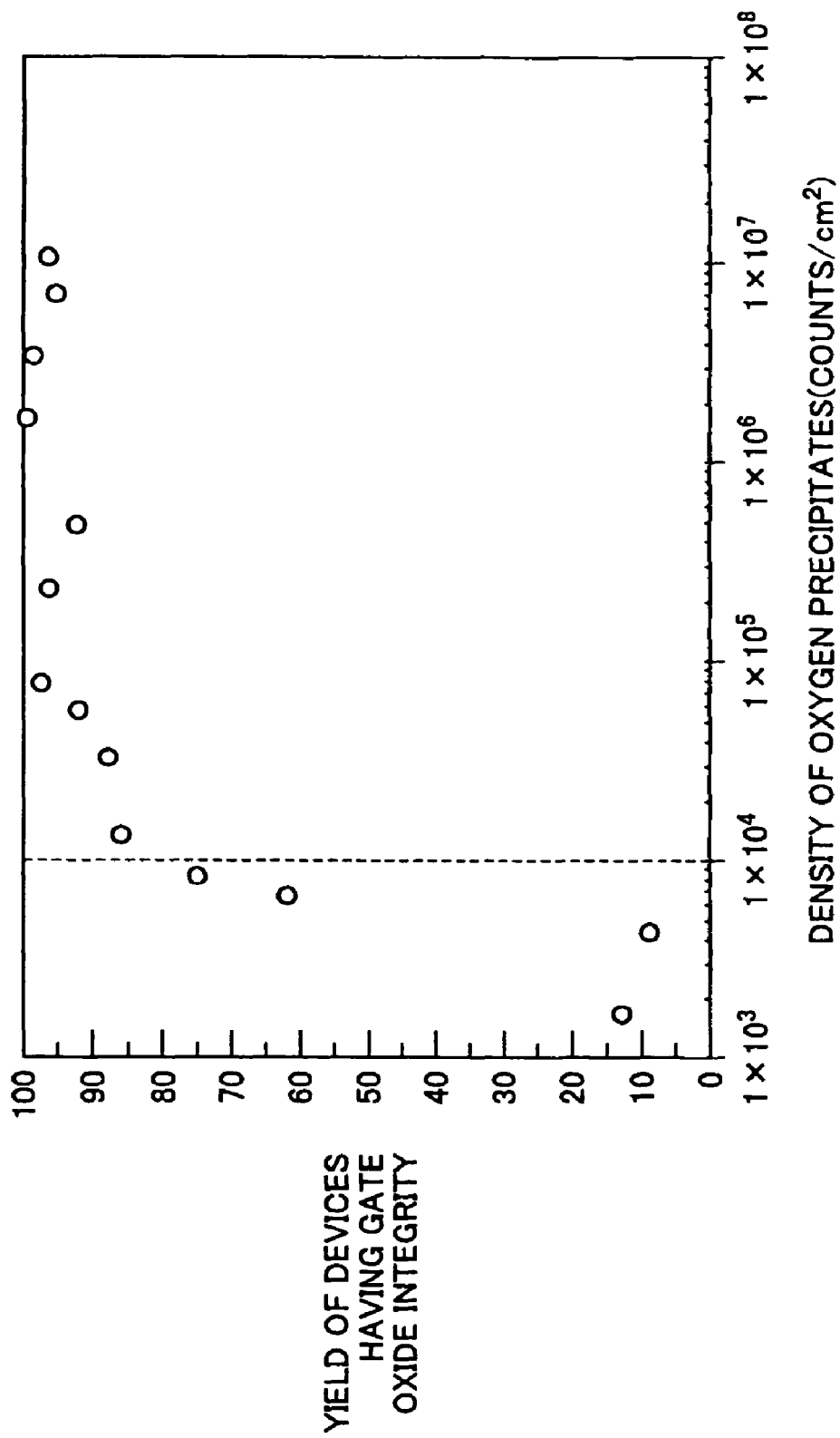
FIG. 2 is a diagram showing the relationship between the density of oxygen precipitates in silicon wafers intentionally contaminated with Ni and the yield of devices having gate oxide integrity.

FIG. 2 is a diagram showing the relationship between the density of oxygen precipitates and the yield of devices having gate oxide integrity in a silicon wafer intentionally contaminated with Ni. In the diagram, it can be recognized that a decreased density of oxygen precipitates down to not more than 1×10$^4$ counts/cm$^2$ causes the withstand voltage of the oxide layer to be deteriorated and the yield of devices having gate oxide integrity to be greatly reduced.

Such deterioration results from the fact that the oxygen precipitates are all gettered by a restricted amount of Ni atoms and the residual Ni atoms form Ni silicide on the surface of the wafer. From the result in FIG. 2, it can be recognized that, as for the wafer intentionally contaminated with Ni, a reduction of the withstand voltage of the oxide layer can be avoided at a density of oxide precipitates of not less than 1×10$^4$ counts/cm$^2$. However, an excessive density of oxygen precipitates may provide a reduction of the mechanical strength due to the excessive amount of precipitates. Taking this fact into account, the upper limit of the density of the oxygen precipitates is set to be 5×10$^6$ counts/cm$^2$.

In the following, the evaluation heat treatment was carried out for the wafers each having one of various sample levels listed in Table 1, and then the density of oxygen precipitates and the thickness of the denuded zone were measured. More specifically, the wafer was subjected to the X high temperature process or the Y low temperature process, and then heat-treated at 1000° C. for 16 hours under an atmosphere of oxidizable gas (100%) in order to observe all the oxygen precipitates. Each sample after the heat treatment was divided into two pieces, and then a selective etching was applied thereto. Thereafter, the section of the wafer was observed with an optical microscope to measure both the density of oxygen precipitates and the thickness of the denuded zone.

Figure 3:
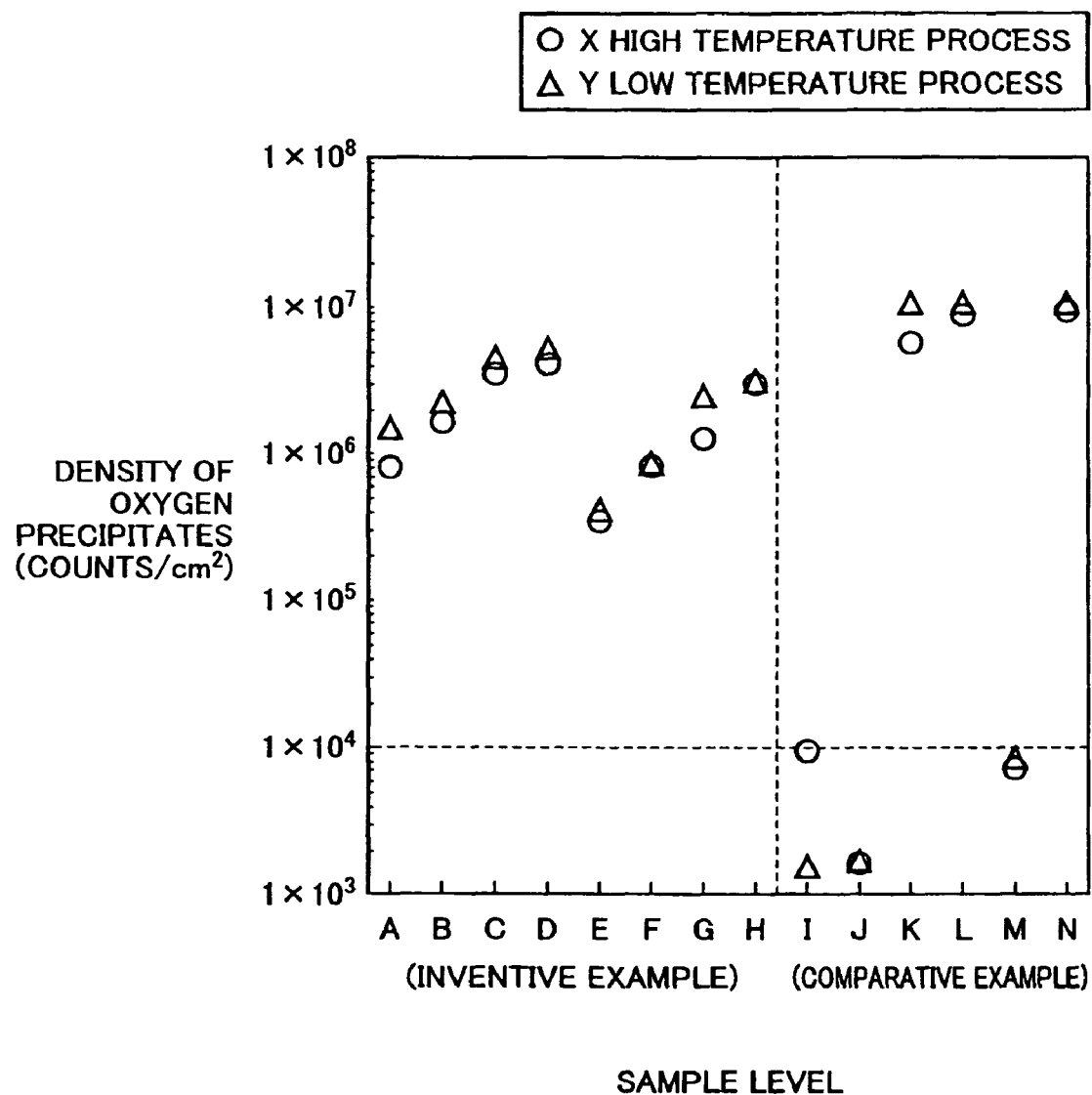
FIG. 3 is a diagram showing the density of oxygen precipitates after the evaluation heat treatment in accordance with the sample levels of Example 1.

FIG. 3 is a drawing showing the density of oxygen precipitates after the evaluation heat treatment for the wafers each having one of the sample levels listed in Example 1. As shown in FIG. 2, sufficient gettering efficiency can be obtained at a density of oxygen precipitates of not less than 1×10$^4$ counts/cm$^2$ for the wafers intentionally contaminated with Ni. Accordingly, oxygen precipitates are formed at a density of more than 1×10$^5$ counts/cm$^2$ in the inventive Examples A-H (No. 1-16), either with the X high temperature process or with the Y low temperature process, and therefore, sufficient gettering efficiency may be expected.

On the contrary, the wafer is doped with no carbon or doped with carbon at a very small concentration in Comparative Examples I, J (No. 17-No. 20) and M (No. 25 and No. 26), so that the density of oxygen precipitates becomes not more than 1×10$^4$ counts/cm$^2$, and therefore no sufficient gettering efficiency may be expected. In Comparative Examples K, L (No. 21-No. 24) and N (No. 27 and No. 28), the DZ treatment is not carried out, or the carbon concentration in the wafer is too high. As a result, oxygen precipitates are formed at a high density of more than 5×10$^6$ counts/cm$^2$, and therefore there is a possibility that the mechanical strength of the wafer is reduced due to an excessive amount of precipitates.

Figure 4:
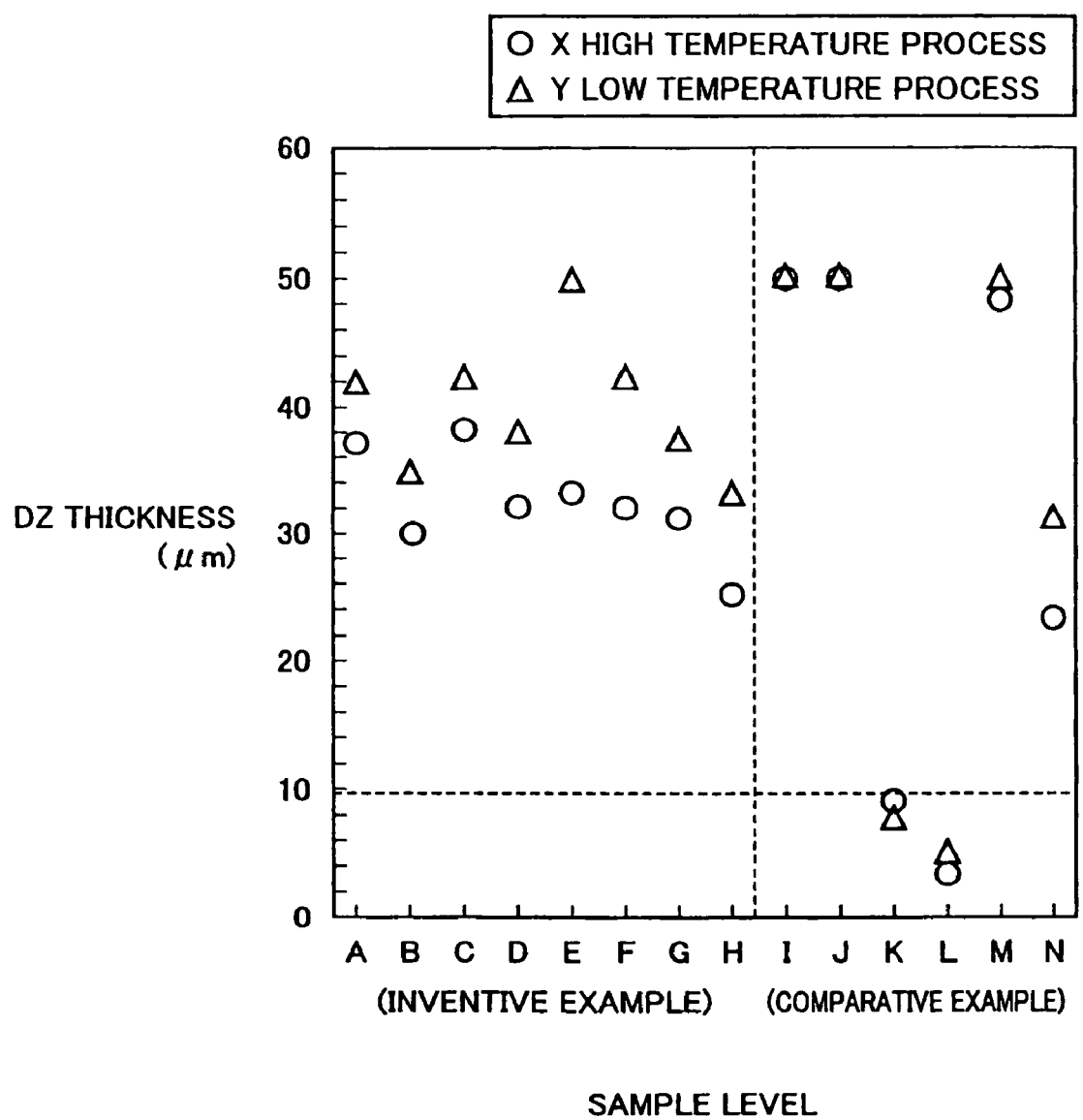
FIG. 4 is a diagram showing the thickness of a denuded zone after the evaluation heat treatment in accordance with the sample levels of Example 1.

FIG. 4 is a diagram showing the thickness of the denuded zone after applying the evaluation heat treatment as for the sample level of Example 1. The thickness of the denuded zone (hereinafter referred to as "DZ thickness"), which is used as an active area of a device in the vicinity of the-surface of a wafer, should be adjusted so as to be a depth of 10 μm or so from the surface, although it depends on the structure of the device to be fabricated. It is important to completely eliminate crystal defects in such an active area of the device.

From FIG. 4, it is clear that the Inventive Examples A-H provide a DZ thickness of not less than 20 μm either with the X high temperature process or with the Y low temperature process. On the contrary, a DZ thickness of not less than 50 μm can be obtained in Comparative Examples I, J and M. However, as shown in FIG. 3, no desired density of oxygen precipitates can be obtained due to no doped carbon or due to lack of the carbon concentration, thereby enabling no gettering efficiency to be expected. In Comparative Examples K and L, no DZ treatment is applied and therefore the thickness of the denuded zone is not less than 10 μm, hence causing the device properties to be negatively influenced.

As a result, it can be stated that an adoption of the parameters regarding the carbon and oxygen concentrations and the heat treatment specified by the present invention provides a silicon wafer having a good quality, wherein the density of oxygen precipitates can be appropriately controlled so as to provide neither a reduction in the gettering efficiency due to a lack of oxygen nor a reduction in the mechanical strength of the wafer due to an excessive amount of precipitation, thereby enabling the crystal defects to be reduced or to be eliminated in the active area of the device.

Figure 5:
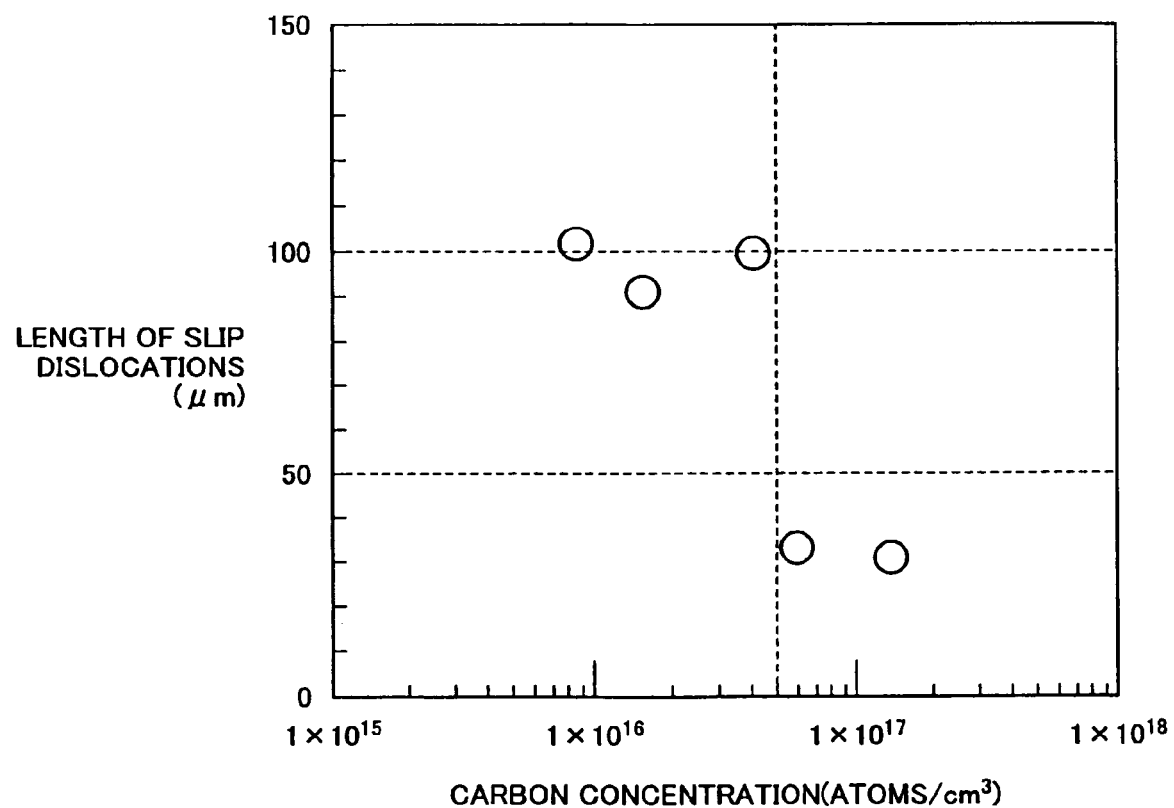
FIG. 5 is a diagram showing the relationship between the carbon concentration and the length of slip dislocations generated in a wafer.

FIG. 5 is a drawing showing the relationship between the carbon concentration and the length of slip dislocations generated in a wafer. In order to obtain a desirable carbon concentration, wafers having a varied carbon concentration were prepared and an indentation test was carried out for each wafer by compulsively applying a stress thereto. Thereafter, the wafer was heat-treated at 1000° C. for 30 min to compulsively generate slip dislocations, and then the length of each slip dislocation generated in the wafer was determined under the observation using an optical microscope.

From the results of observation with the optical microscope, it can be recognized that a decreased length of the slip dislocations enhances the mechanical strength. All the wafers tested had an oxygen concentration of $13.1 \times 10^{17}$ atoms/cm$^3$ (OLD ASTM).

From the results in FIG. 5, it is found that a sufficient mechanical strength can be obtained at a carbon concentration of $5 \times 10^{16}$ atoms/cm$^3$ (NEW ASTM). However, doping an excessive amount of carbon causes an excessive amount of oxygen precipitates to be generated in the wafer, so that the mechanical strength of the wafer is reduced. Accordingly, it is preferable that the carbon concentration ranges from $5 \times 10^{16}$-$15 \times 10^{16}$ atoms/cm$^3$ (NEW ASTM) to maintain sufficient mechanical strength for the wafer.

Example 2

A p-type <100> silicon wafer having a specific resistivity of 10Ω·cm was prepared, using the CZ method, in which case, the silicon wafer included carbon at a fixed concentration of $2 \times 10^{16}$ atoms/cm$^3$ and oxygen at a varied concentration of $11 \times 10^{17}$ atoms/cm$^3$-$18 \times 10^{17}$ atoms/cm$^3$. A high temperature heat treatment was carried out both at 1000° C. for one hour and at 1200° C. for one hour under a nitrogen gas atmosphere containing oxygen gas at a concentration of 3%. The sample level of the prepared wafers is shown in Table 2.

In Example 2, each sample of wafer was applied to an evaluation heat treatment of the Y low temperature process, and then heat-treated at 1000° C. for 16 hours under an atmosphere of oxidizable gas (100%) to observe all the oxygen precipitates in the wafer. After a low temperature heat treatment, each sample was divided into two pieces and selectively etched. Thereafter, the section of each sample was observed with an optical microscope to determine both the density of oxygen precipitates and the thickness of the denuded zone.

Figure 6:
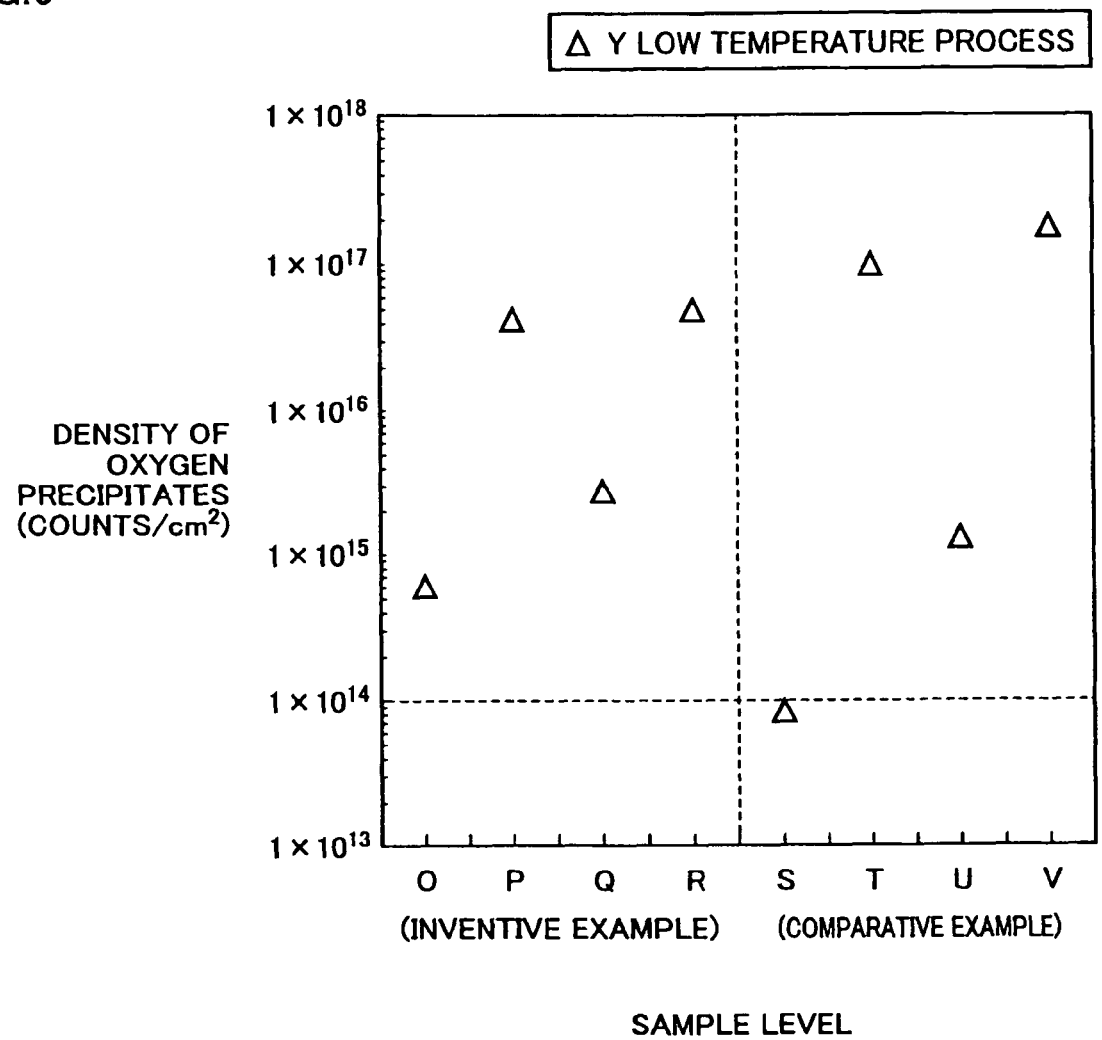
FIG. 6 is a diagram showing the density of oxygen precipitates after the evaluation heat treatment in accordance with the sample levels of Example 2.
Figure 7:
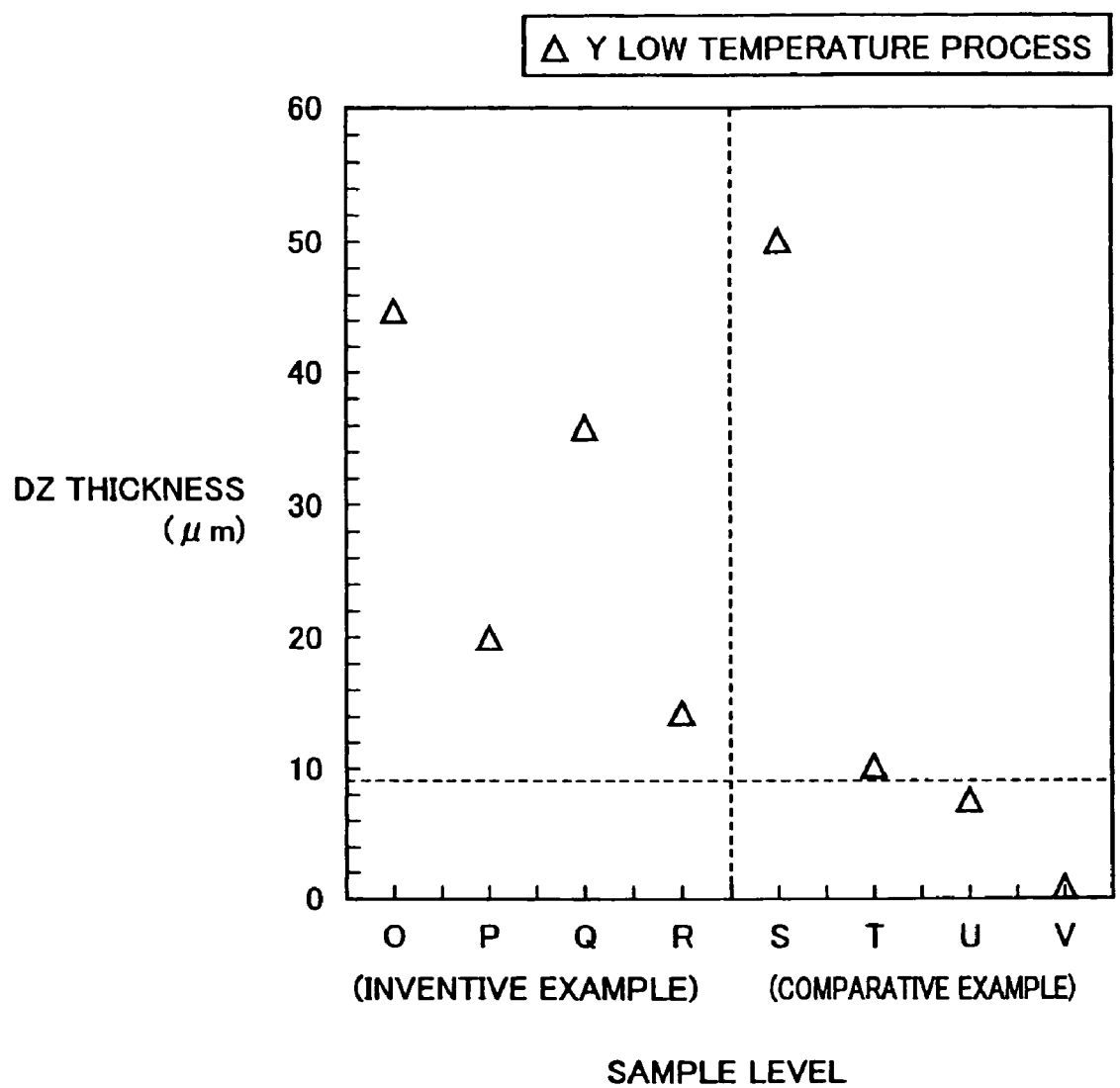
FIG. 7 is a diagram showing the thickness of a denuded zone after the evaluation heat treatment in accordance with the sample levels of Example 2.

FIG. 6 is a diagram showing the density of oxygen precipitates after the evaluation heat treatment in the sample levels of Example 2. FIG. 7 is a diagram showing the DZ thickness after applying the evaluation heat treatment in the sample levels of Example 2. From both diagrams, it is found that in the Inventive Example O-R (No. 29-32), oxygen precipitates at a density of not less than $1 \times 10^4$ counts/cm$^2$ are formed, thereby enabling a sufficient gettering efficiency to be obtained, and further a DZ thickness of not less than 20 μm or at least not less than 10 μm can be obtained.

In Comparative Example S (No. 33), however, the density of oxygen precipitates is not more than $1 \times 10^4$ counts/cm$^2$, thereby enabling no sufficient gettering efficiency to be expected. In Comparative Examples T, U, V (No. 34-36), a sufficient density of oxygen precipitates can be obtained, but the DZ thickness is less than 10 μm. Such a reduced amount of the thickness causes the device properties to be deteriorated.

In the above Examples 1 and 2, all the DZ treatments were carried out under a mixed gas atmosphere of oxygen and nitrogen gases. When the mixed gas was replaced with hydrogen gas, substantially the same effect was obtained as for the density of oxygen precipitates, and it was confirmed that the grown-in defects were more prominently eliminated in the denuded zone.

As described above, in the silicon wafer and the method for manufacturing the same according to the present invention, both the oxygen concentration and the carbon concentration are controlled in the process of growing a single crystal with the CZ method, so that a desired amount of the density of precipitates can be obtained in the process of fabricating the device without application of the IG treatment after the DZ treatment, thereby enabling sufficient gettering efficiency to be obtained. Moreover, no requirement of the IG process causes the productivity to be enhanced with a reduced cost. When the wafer is used as an epitaxial wafer, no defects are generated in an epitaxial layer, since a denuded zone has already been formed on the surface of the wafer before the epitaxial layer is grown. As a result, desired gettering efficiency can similarly be obtained in the process of manufacturing devices.

What is claimed is:

1. A silicon wafer in which the oxygen concentration and the carbon concentration are controlled respectively within a range of $11 \times 10^{17}$-$17 \times 10^{17}$ atoms/cm$^3$ (OLD ASTM) and

TABLE 2

| Classification | No. | Sample Level | Evaluation Heat Treatment | Oxygen Concentration (atoms/cm$^3$) | Carbon Concentration (atoms/cm$^3$) | High Temperature Heat Temperature Condition |
|---|---|---|---|---|---|---|
| Inventive Example | 29 | O | Y process | $11 \times 10^{17}$ | $2 \times 10^{16}$ | 1200° C. × 1 hr |
| | 30 | P | Y process | $17 \times 10^{17}$ | $2 \times 10^{16}$ | 1200° C. × 1 hr |
| | 31 | Q | Y process | $11 \times 10^{17}$ | $5 \times 10^{16}$ | 1200° C. × 1 hr |
| | 32 | R | Y process | $17 \times 10^{17}$ | $5 \times 10^{16}$ | 1200° C. × 1 hr |
| Comparative Example | 33 | S | Y process | $10 \times 10^{17}$ | $2 \times 10^{16}$ | 1200° C. × 1 hr |
| | 34 | T | Y process | $18 \times 10^{17}$ | $2 \times 10^{16}$ | 1200° C. × 1 hr |
| | 35 | U | Y process | $11 \times 10^{17}$ | $2 \times 10^{16}$ | 1000° C. × 1 hr |
| | 36 | V | Y process | $17 \times 10^{17}$ | $2 \times 10^{16}$ | 1000° C. × 1 hr | within a range of more than $5\times10^{16}$ to $15\times10^{16}$ atoms/cm$^3$ (NEW ASTM), wherein a denuded zone having no crystal defects due to the existence of oxygen is formed on the surface and in the vicinity thereof, and wherein oxygen precipitates are formed at a density of $1\times10^4$ counts/cm$^2$-$5\times10^6$ counts/cm$^2$, when a heat treatment is carried out at 500-1000° C. for 1 to 24 hours.

2. A silicon wafer according to claim 1, wherein the thickness of said denuded zone is not less than 10 μm.

* * * * *